(12) United States Patent
Fukada

(10) Patent No.: US 7,507,662 B2
(45) Date of Patent: Mar. 24, 2009

(54) FERROELECTRIC MEMORY AND ITS MANUFACTURING METHOD

(75) Inventor: Shinichi Fukada, Hamura (JP)

(73) Assignee: Seiko Epson Corporation (JP)

( * ) Notice: Subject to any disclaimer, the term of this patent is extended or adjusted under 35 U.S.C. 154(b) by 287 days.

(21) Appl. No.: 11/468,962

(22) Filed: Aug. 31, 2006

(65) Prior Publication Data

US 2007/0045690 A1 Mar. 1, 2007

(30) Foreign Application Priority Data

Sep. 1, 2005 (JP) ............... 2005-253238

(51) Int. Cl.
*H01L 21/44* (2006.01)
(52) U.S. Cl. .................................. 438/668
(58) Field of Classification Search ........... 438/256, 438/399, 668, 675; 257/360, 365
See application file for complete search history.

(56) References Cited

U.S. PATENT DOCUMENTS 6,825,076 B2 * 11/2004 Okita .................... 438/239

6,953,950 B2 * 10/2005 Sashida .................. 257/69

FOREIGN PATENT DOCUMENTS

| JP | 2004-006593 | 1/2004 |
|----|-------------|--------|
| JP | 2005-026332 | 1/2005 |

* cited by examiner

*Primary Examiner*—Calvin Lee
(74) *Attorney, Agent, or Firm*—Harness, Dickey & Pierce, P.L.C.

(57) ABSTRACT

A ferroelectric memory includes a substrate, an interlayer dielectric layer composed of at least one layer formed above the substrate, a plurality of ferroelectric capacitors formed above the interlayer dielectric layer, a coating layer that covers the plurality of ferroelectric capacitors, a first opening section provided between the plurality of ferroelectric capacitors, a second opening section that is connected to the first opening section and formed in the coating layer and the interlayer dielectric layer, and a conductive layer provided in one piece inside the first opening section and the second opening section.

14 Claims, 5 Drawing Sheets

FERROELECTRIC MEMORY AND ITS MANUFACTURING METHOD

The entire disclosure of Japanese Patent Application No. 2005-253238, filed Sep. 1, 2005 is expressly incorporated by reference herein.

BACKGROUND

1. Technical Field

The present invention relates to ferroelectric memories and methods for manufacturing the same.

2. Related Art

As a ferroelectric memory having a stacked structure, a structure in which a plug is connected to one of selection transistors, a ferroelectric capacitor is formed on the plug, another plug is connected to the other of the selection transistors, and a bit line is formed on the other plug is known. Each of the plugs connected to each of the bit lines is disposed between adjacent ones of the ferroelectric capacitors, such that arrangement and fabrication of the plugs would become very difficult with further miniaturization and higher density arrangement of capacitors. Also, further device miniaturization may cause the manufacturing process to become more complicated, for example, because the plugs and the bit lines are formed separately from one another in the ferroelectric memory described above, which requires mask positioning to be conducted with high accuracy. An example of related art is described in Japanese laid-open patent application JP A-2004-6563.

SUMMARY

In accordance with an advantage of some aspects of the present invention, it is possible to provide a ferroelectric memory and a method for manufacturing the same, which can accommodate further device miniaturization and higher density and facilitate the manufacturing process.

(1) A ferroelectric memory in accordance with an embodiment of the invention includes a substrate, an interlayer dielectric layer composed of at least one layer formed above the substrate, a plurality of ferroelectric capacitors formed above the interlayer dielectric layer, a coating layer that covers the plurality of ferroelectric capacitors, a first opening section provided between the plurality of ferroelectric capacitors, a second opening section that is connected to the first opening section and formed in the coating layer and the interlayer dielectric layer, and a conductive layer provided in one piece inside the first and second opening sections.

According to the present embodiment, the conductive layer is provided in one piece inside the first and second opening sections. Accordingly, wirings in a predetermined pattern and contacts to the substrate side can be formed in one piece. Therefore, compared to the case where wirings and contacts are formed separately from one another, misalignment among them can be better prevented, and the structure can be simplified because the number of device elements is reduced. Accordingly, a ferroelectric memory that can accommodate miniaturization and higher density device arrangement can be provided.

It is noted that, in descriptions of the invention,. providing a member B above a specific member A includes a case in which B is directly provided on A, and a case in which B is provided over A through another layer or the like. This similarly applies to other embodiments of the invention to be described below.

(2) In the ferroelectric memory, a first plug that is electrically connected to one of the ferroelectric capacitors and a second plug that is exposed through the second opening section may be formed in the interlayer dielectric layer.

(3) In the ferroelectric memory, the width of the second opening section may be greater than the width of the second plug.

(4) In the ferroelectric memory, the width of the first opening section may be greater than the width of the second opening section.

(5) In the ferroelectric memory, an upper surface of the conductive layer may be flush with an upper surface of the coating layer.

(6) In the ferroelectric memory, the plurality of ferroelectric capacitors may be arranged in a plurality of rows and a plurality of columns, and the minimum gap between adjacent ones of the ferroelectric capacitors arranged in the direction of the columns may be greater than the minimum gap between adjacent ones of the ferroelectric capacitors arranged in the direction of the rows.

(7) In the ferroelectric memory, the conductive layer may be disposed between adjacent ones of the ferroelectric capacitors arranged in the direction of the columns and may extend in the direction of the rows.

(8) In the ferroelectric memory, the ferroelectric capacitor defines a plane configuration having a major axis, and the major axis may be inclined diagonally with respect to the direction of the rows.

(9) A method for manufacturing a ferroelectric memory in accordance with another embodiment of the invention includes the steps of: (a) forming a plurality of ferroelectric capacitors above an interlayer dielectric layer composed of at least one layer above a substrate; (b) forming a coating layer that covers the plurality of ferroelectric capacitors and has a first opening section provided between the plurality of ferroelectric capacitors; (c) forming a second opening section that is connected to the first opening section and provided in the coating layer and the interlayer dielectric layer; (d) forming a conductive layer in one piece inside the first and second opening sections and above the coating layer; and (e) polishing at least the conductive layer.

According to an aspect of the embodiment of the invention described above, the conductive layer is formed inside the first and second opening sections and above the coating layer in one piece, and then at least the conductive layer is polished. By this, for example, a wiring having a predetermined pattern can be formed with the first opening section, and a contact to the substrate side can be formed with the second opening section. Because the wiring and the contact can be formed in one piece, the number of film forming steps and patterning steps can be reduced, and the manufacturing process can be facilitated, compared to the case where they are formed separately from one another.

(10) In the method for manufacturing a ferroelectric memory, the conductive layer and the coating layer may be polished in the step (e).

DESCRIPTION OF EXEMPLARY EMBODIMENTS

Preferred embodiments of the invention are described below with reference to the accompanying drawings.

Figure 7:
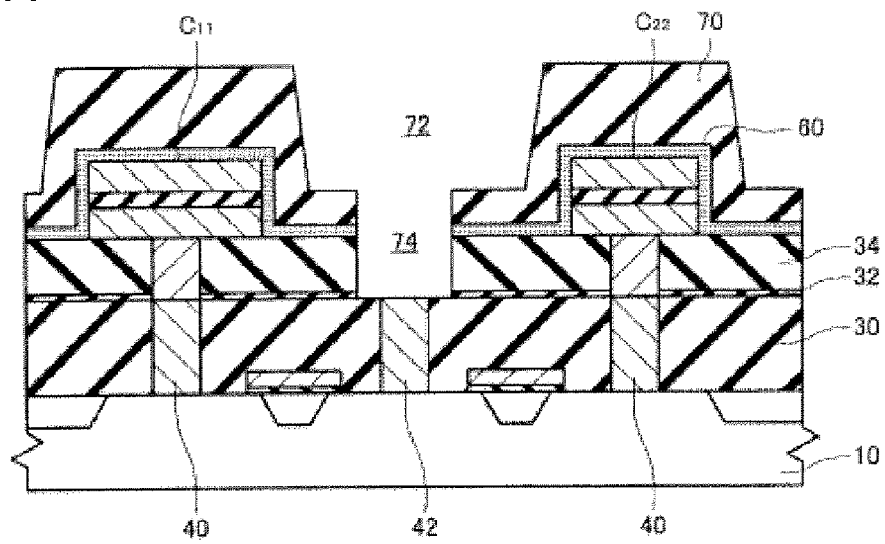
FIG. 7 is a cross-sectional view schematically showing a step of the method for manufacturing a ferroelectric memory in accordance with the embodiment of the invention.
Figure 8:
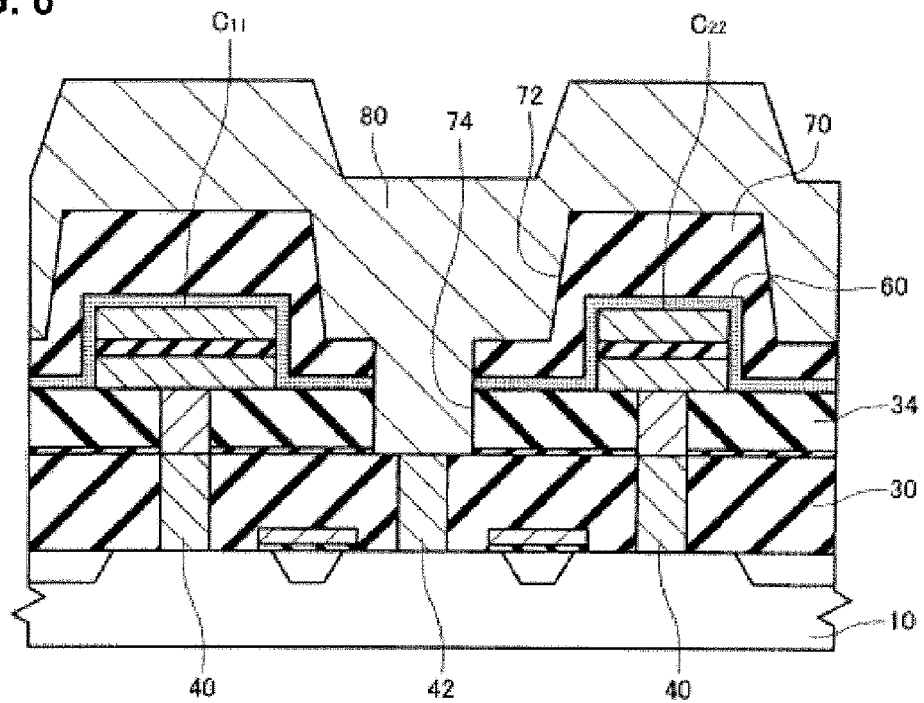
FIG. 8 is a cross-sectional view schematically showing a step of the method for manufacturing a ferroelectric memory in accordance with the embodiment of the invention.
Figure 9:
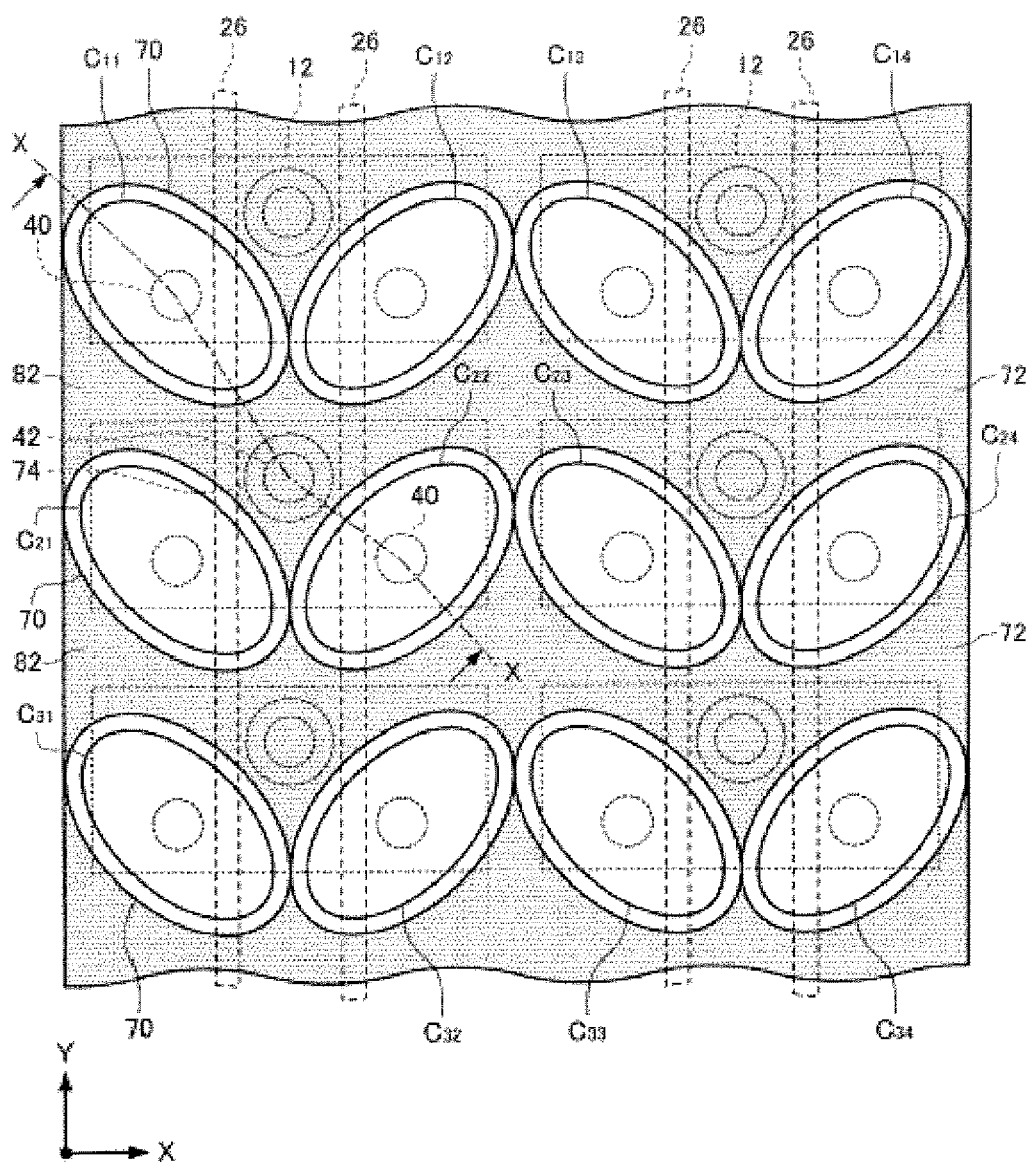
FIG. 9 is a plan view in part of a ferroelectric memory in accordance with an embodiment of the invention.
Figure 10:
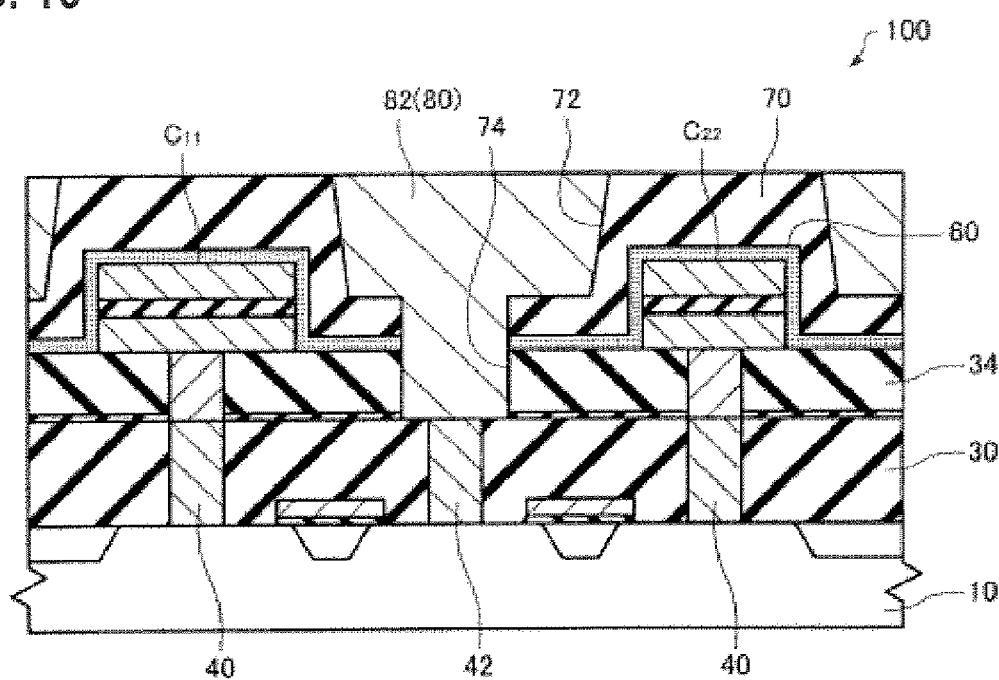
FIG. 10 is a cross-sectional view taken along a line X-X indicated in FIG. 9.

FIGS. 1-10 are cross-sectional views schematically showing steps of a method for manufacturing a ferroelectric memory in accordance with an embodiment of the invention. FIG. 9 is a plan view in part of the ferroelectric memory in accordance with the embodiment, and FIG. 10 is a cross-sectional view taken along a line X-X indicated in FIG. 9.

Figure 1:
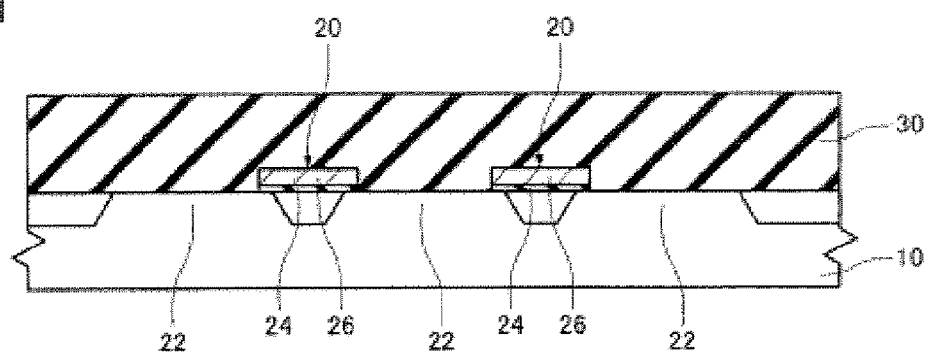
FIG. 1 is a cross-sectional view schematically showing a step of a method for manufacturing a ferroelectric memory in accordance with an embodiment of the invention.

As shown in FIG. 1, a substrate 10 is prepared. The substrate 10 is a semiconductor substrate (for example, a silicon substrate), and includes a plurality of semiconductor elements (for example, MOS transistors) 20 formed thereon. Each of the semiconductor elements 20 includes an impurity region 22, a gate dielectric layer 24 and a gate electrode 26. The semiconductor elements 20 may be so-called selection transistors.

First, an interlayer dielectric layer 30 is formed on the substrate 10. As the interlayer dielectric layer 30, for example, a BPSG (boro-phospho SG), a NSG (non-doped SG), a PTEOS (plasma TEOS) and other oxide layers may be used. The interlayer dielectric layer 30 is formed on a surface side of the substrate 10 where the plural semiconductor elements 20 are formed. The interlayer dielectric layer 30 may be formed by, for example, a CVD (Chemical Vapor Deposition) method. The top surface of the interlayer dielectric layer 30 may be planarized by, for example, a CMP (Chemical Mechanical Polishing) method.

Figure 2:
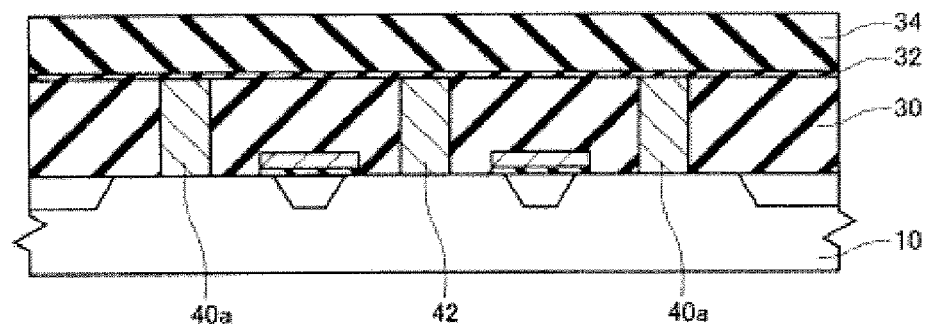
FIG. 2 is a cross-sectional view schematically showing a step of the method for manufacturing a ferroelectric memory in accordance with the embodiment of the invention.

Next, as shown in FIG. 2, a plurality of opening sections are formed in the interlayer dielectric layer 30 by, for example, dry etching, thereby exposing the impurity regions 12 of the substrate 10. Then, plugs 40a and 42 are formed in the plural openings sections. More concretely, a conductive layer composed of a plug material is formed inside the opening sections and on the top surface of the interlayer dielectric layer 30, and the conductive layer is polished by, for example, a CMP method. The plugs 40a and 42 are electrically connected to the semiconductor elements 20, and may include a core layer (for example, a tungsten (W) layer) and a barrier layer (for example, a titanium (Ti) layer, a titanium nitride (TiN) layer). The barrier layer can prevent diffusion of impurity and improve adhesion.

A protection layer 32 that covers the plugs 40a and 42 may be formed over the interlayer dielectric layer 30, if necessary. The protection layer 32 may be formed from, for example, a silicon oxinitride (SiON) layer, to a film thickness of, for example, 50 nm. The protection layer 32 can prevent impacts of a ferroelectric capacitor forming process to be described below (for example, oxidation in the ferroelectric capacitor forming process) from affecting the plug 42.

Figure 3:
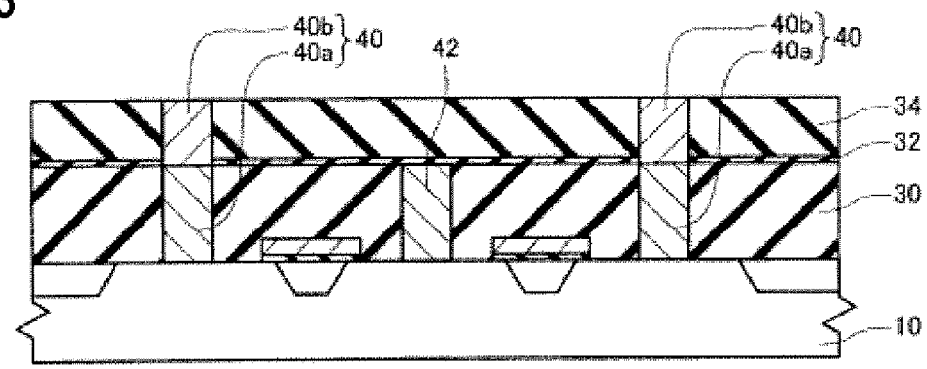
FIG. 3 is a cross-sectional view schematically showing a step of the method for manufacturing a ferroelectric memory in accordance with the embodiment of the invention.

Then, as shown in FIG. 2 and FIG. 3, an interlayer dielectric layer 34 is further formed on the interlayer dielectric layer 30 (on the protection layer 32 in FIG. 2), and plugs 40b are formed in the interlayer dielectric layer 34. The details described above for forming the interlayer dielectric layer 30 may be applied to the material and forming method for forming the interlayer dielectric layer 34. The interlayer dielectric layer 34 may be formed to a thickness of, for example, 100 µm. The plugs 40b can be formed on the plugs 40a described above. They can be formed by the same forming method as applied to the plugs 40a described above.

In this manner, as shown in FIG. 3, the first plugs 40 (including the plugs 40a and 40b) and the second plug 42 can be formed in the interlayer dielectric layer composed of at least one layer (the plural interlayer dielectric layers 30 and 34 in the example shown in FIG. 3). The first plugs 40 define contact sections that electrically connect the semiconductor elements 20 and ferroelectric capacitors to be described below. Further, the second plug 42 defines a contact section that electrically connects the semiconductor elements 20 to a conductive layer 82 to be described below. Before the step of forming ferroelectric capacitors, only the first plugs 40 may preferably be exposed, and the second plug 42 may preferably be covered by the protection layer 32 and the interlayer dielectric layer 34.

Figure 4:
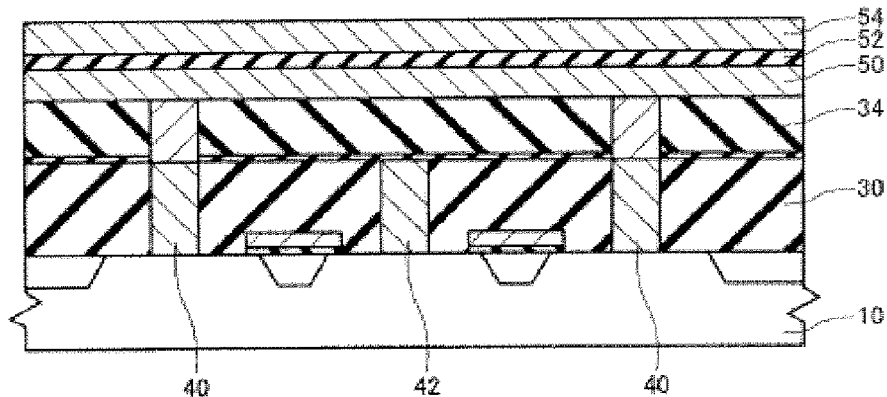
FIG. 4 is a cross-sectional view schematically showing a step of the method for manufacturing a ferroelectric memory in accordance with the embodiment of the invention.
Figure 5:
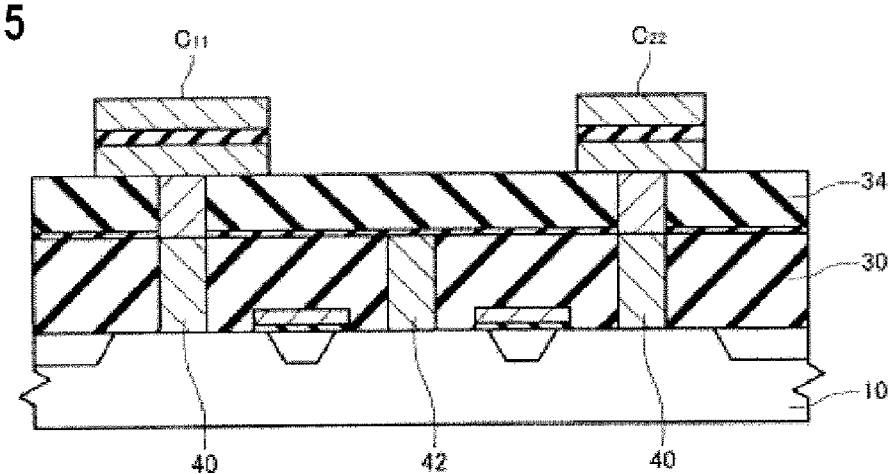
FIG. 5 is a cross-sectional view schematically showing a step of the method for manufacturing a ferroelectric memory in accordance with the embodiment of the invention.

Next, as shown in FIG. 4 and FIG. 5, plural ferroelectric capacitors $C_{11}$, $C_{22}$, etc. are formed.

First, as shown in FIG. 4, a lower electrode layer 50, a ferroelectric layer 52 and an upper electrode layer 54 are sequentially laminated on the interlayer dielectric layer 34 including areas above the first plugs 40. The lower electrode layer 50 and the upper electrode layer 54 may be formed from, for example, Pt, Ir, Ir oxide (IrOx), Ru, Ru oxide (RuOx), SrRu compound oxide (SrRuOx) or the like. A buffer layer (not shown) may be formed between the lower electrode layer 50 and the first plugs 40. In this case, the buffer layer may be formed from, for example, a titanium (Ti) layer, a titanium nitride (TiN) layer, a titanium aluminum nitride (TiAlN) layer or the like. Each of the lower electrode layer 50 and the upper electrode layer 54 may be composed of a single layer or plural layers, and may be formed by, for example, a sputter method, a vacuum vapor deposition method, a CVl) method, or the like. Also, the ferroelectric layer 52 includes a ferroelectric material having a perovskite type crystal structure. The ferroelectric material is not limited to any particular materials, and for example, PZT system ferroelectrics composed of oxides including Pb, Zr and Ti as constituent elements can be used. Alternatively, as the ferroelectric materials, any of SBT system, BST system, BIT system and BLT system materials may be used. The ferroelectric layer 52 may be formed by, for example, a solution coating method (including a sol-gel method or a MOD (Metal Organic Decomposition) method), a sputter method, a CVD (Chemical Vapor Deposition) method, a MOCVD (Metal Organic Chemical Vapor Deposition) method, or the like.

Then, as shown in FIG. 5, the lower electrode layer 50, the laminated body of the ferroelectric layer 52 and the upper electrode layer 54 is patterned, thereby forming plural ferroelectric capacitors $C_{11}$ and $C_{22}$. The patterning step may be conducted through disposing a mask (for example, a resist mask or a hard mask) on the laminated body, and removing areas of the laminated body exposed through the mask by etching.

In this manner, the plural ferroelectric capacitors $C_{11}$ and $C_{22}$, each including the lower electrode layer 50, the ferroelectric layer 52 and the upper electrode layer 54, can be formed. The plural ferroelectric capacitors $C_{11}$ and $C_{22}$ are electrically connected to the substrate 10 by the plural first plugs 40, respectively.

After the ferroelectric capacitors $C_{11}$ and $C_{22}$ are formed, an anneal treatment is conducted in an oxygen ($O_2$) atmosphere. The anneal treatment can be a so-called recovery anneal for recovering the ferroelectric capacitors $C_{11}$ and $C_{22}$ from etching damages. In the present embodiment, the second plug 42 is covered by the protection layer 32 and the interlayer dielectric layer 34 at the time of the anneal treatment, such that the second plug 42 can be prevented from being oxidized, and its electrical connection reliability can be improved.

Figure 6:
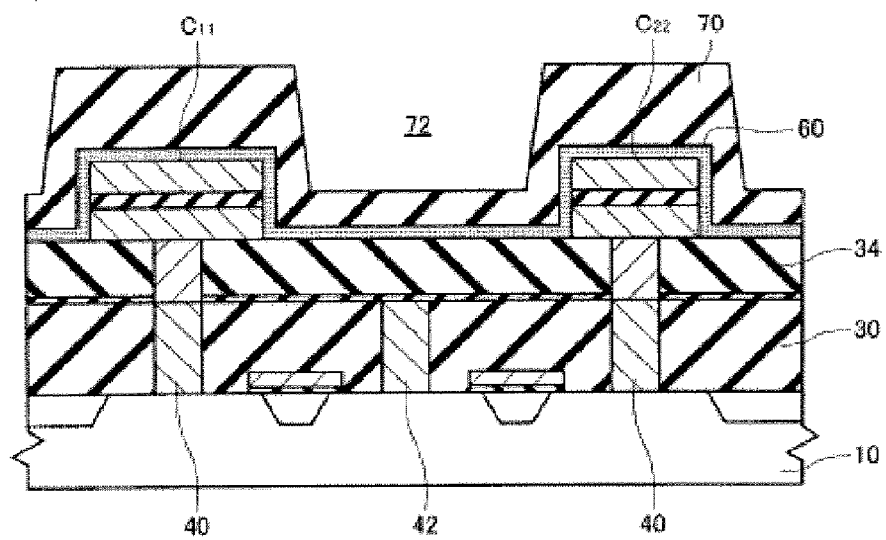
FIG. 6 is a cross-sectional view schematically showing a step of the method for manufacturing a ferroelectric memory in accordance with the embodiment of the invention.

A block layer 60 that covers the plural ferroelectric capacitors $C_{11}$ and $C_{22}$ may be formed, if necessary, as shown in FIG. 6. The block layer 60 functions as a hydrogen barrier for the ferroelectric capacitors $C_{11}$ and $C_{22}$. The block layer 60 may be formed from, for example, an aluminum oxide ($Al_2O_3$) layer. It is noted that the block layer 60 may be formed by, for example, a sputter method or a CVD method (for example, an ALCVD (Atomic Layer CVD) method).

Then, a coating layer 70 that covers the plural ferroelectric capacitors $C_{11}$ and $C_{22}$ is formed. The coating layer 70 may be formed by, for example, a CVD method, with the material used for forming the interlayer dielectric layer 30 described above (for example, PTEOS). The coating layer 70 is formed in a conformal shape that conforms to the protruded shape of the underlying ferroelectric capacitors $C_{11}$ and $C_{22}$. In other words, the coating layer 70 is formed in a manner that a first opening section 72 is provided between the ferroelectric capacitors $C_{11}$ and $C_{22}$. Referring to FIG. 9, the first opening section 72 may be formed between adjacent ones of the ferroelectric capacitors arranged in a column direction (Y direction), in a manner to extend in a row direction (X direction). Also, the coating layer 70, which is provided between adjacent ones of the ferroelectric capacitors arranged in the X direction, is formed to a level higher than the top surface of any of the ferroelectric capacitors. By so doing, the top surfaces of the ferroelectric capacitors would not be exposed in a polishing step to be described later, and the plural conductive layers 82 can be separated from one another in the column direction.

Next, as shown in FIG. 7, a second opening section 74 that is connected to the first opening section is formed. The second opening section 74 is formed in a manner to penetrate through at least the coating layer 70 and the interlayer dielectric layer 34 (more concretely, the coating layer 70, the block layer 60, the interlayer dielectric layer 34 and the protection layer 32 in the illustrated example). By this, the second plug 42 is exposed through the second opening section 74. In this case, a plurality of the second plugs 42 may be exposed by a plurality of the second opening sections 74, respectively, or a plurality of the second plugs 42 may be exposed integrally through a single one of the second opening section 72. It is noted that the first and second opening sections 72 and 74 may be formed by, for example, dry etching.

It is noted that the width of each of the first opening section 72, the second opening section 74 and the second plug 42 is not limited to a particular width. However, for example, the width of the first opening section 72 may be greater than the width of the second opening section 74, or they can be the same. Also, the width of the second opening section 74 may be greater than the width of the second plug 42, or they may be the same. When the width of the opening section in an upper layer is greater than the width of the opening section or the plug in a lower layer, a greater alignment margin can be obtained, such that misalignment can be prevented and electrical connection reliability can be improved.

Then, as shown in FIG. 8, a conductive layer 80 is formed in one piece inside the first and second opening section 72 and 74 and on the coating layer 70. The conductive layer 80 may be composed of a single layer or a plurality of layers. In the case of a plurality of layers, for example, the contact layer 80 may include a core layer (for example, a tungsten (W) layer) and a barrier layer (for example, a titanium (Ti) layer, a titanium nitride (TiN) layer) that is in contact with the coating layer 70. The conductive layer 80 may be formed by, for example, a CVD method. The conductive layer 80 is formed in a manner that at least the first and second opening sections 72 and 74 are entirely embedded with the conductive layer 80.

Then, by polishing at least the conductive layer 80, a conductive layer 82 can be formed between the ferroelectric capacitors $C_{11}$ and $C_{22}$, as shown in FIG. 10. The polishing step may be conducted by, for example, a CMP method. Also, in the present polishing step, only the conductive layer 80 may be polished until the top surface of the coating layer 70 is exposed, or the conductive layer 80 and the coating layer 70 may be polished until after the coating layer 70 is exposed. In the latter case, polishing is stopped before the top surfaces of the ferroelectric capacitors $C_{11}$ and $C_{22}$ are exposed (in other words, in a state in which the coating layer 70 still remains on the ferroelectric capacitors $C_{11}$ and $C_{22}$). The top surface of the conductive layer 82 may be flush with the top surface of the coating layer 70. It is noted that unnecessary portions of the conductive layer 82 remaining in areas other than the memory cell array region can be removed by, for example, etching.

In this manner, as shown in FIG. 9 and FIG. 10, a ferroelectric memory 100 is manufactured. According to the method for manufacturing a ferroelectric memory in accordance with the present embodiment, the contact layer 80 is formed in one piece inside the first and second opening sections 72 and 74 and above the coating layer 70, and then at least the contact layer 80 is polished. As a result, for example, a wiring in a predetermined pattern can be formed with the first opening section 72, and a contact to the substrate 10 can be formed with the second opening section 74. In addition, because the wiring and the contact are formed in one piece, the number of film forming step and patterning step can be reduced, and therefore the manufacturing process can be more facilitated, compared to the case in which they are formed separately from one another.

The ferroelectric memory 100 includes a plurality of ferroelectric capacitors $C_{nm}$ (disposed at the n-th row and the m-th column (n and m are both natural numbers)) arranged in a plurality of rows and a plurality of columns. A plurality of conductive layers 82 are formed in a manner to extend in the row direction with each of the conductive layers 82 being disposed between adjacent ones of the ferroelectric capacitors arranged in the column direction. Each of the conductive layers 82 is electrically connected to the semiconductor elements 20 through the second plug 42. When the semiconductor elements 20 define selection transistors, the conductive layer 82 is called a bit wiring.

In the example shown in FIG. 9, the minimum gap between adjacent ones of the ferroelectric capacitors in the column direction (for example, between $C_{11}$ and $C_{21}$) is greater than the minimum gap between adjacent ones of the ferroelectric capacitors in the row direction (for example, $C_{11}$ and $C_{12}$). As a result, the coating layer 70 described above can be formed in a manner that gaps between adjacent ones of the ferroelectric capacitors in the row direction are embedded, while the first opening sections 72 are provided between adjacent ones of the ferroelectric capacitors in the column direction. Accordingly, the conductive layers 82 that are separated from one another in the column direction can be readily formed.

For example, each of the ferroelectric capacitors may have a plane configuration having a major axis. In this case, the major axis of the ferroelectric capacitor may be inclined (for example, at 45°) with respect to the row direction. More concretely, the major axes of adjacent ones of the ferroelectric capacitors arranged in the row direction are symmetrical through a line extending in parallel with the column direction, in other words, may be inclined alternately in different directions in the row direction. By so doing, the ferroelectric memory 100 can be made more compact on design, by giving consideration to the size and other factors of the impurity regions 12 in the substrate 10 (in other words, the forming regions of the semiconductor elements 20) and the ferroelectric capacitors. Further, the plane configuration of the ferroelectric capacitor is not limited to the one described above, and a variety of configurations, such as, for example, a square shape, a circular shape and the like can be adopted.

It is noted that other details of the structure of the ferroelectric capacitor in accordance with the present embodiment include contents that can be derived from the manufacturing method described above.

According to the ferroelectric memory in accordance with the present embodiment, the conductive layer 82 is provided in one piece inside the first and second opening sections 72 and 74. Accordingly, a wiring in a predetermined pattern and a contact to the side of the substrate 10 can be formed in one piece. For this reason, compared to the case where wirings and contacts are formed separately from one another, misalignment among them can be better prevented, and the structure can be simplified because the number of device elements is reduced. Accordingly, a ferroelectric memory that can accommodate miniaturization and higher density device arrangement can be provided.

The present invention is not limited to the embodiment described above, and many modifications can be made. For example, the present invention may include compositions that are substantially the same as the compositions described in the embodiment (for example, a composition with the same function, method and result, or a composition with the same objects and result). Also, the present invention includes compositions in which portions not essential in the compositions described in the embodiments are replaced with others. Also, the present invention includes compositions that achieve the same functions and effects or achieve the same objects of those of the compositions described in the embodiments. Furthermore, the present invention includes compositions that include publicly known technology added to the compositions described in the embodiments.

What is claimed is:

1. A method for manufacturing a ferroelectric memory, the method comprising the steps of:
    forming an interlayer dielectric layer above a substrate;
    forming a plug in the interlayer dielectric layer;
    forming a first and second ferroelectric capacitors on the interlayer dielectric layer, the plug being formed between the first and second ferroelectric capacitors;
    forming a coating layer that covers each of the ferroelectric capacitors having a first opening section provided between the plurality of ferroelectric capacitors;
    forming a second opening section that is connected to the first opening section and provided in the coating layer and the interlayer dielectric layer;
    after forming the plug, the first and second ferroelectric capacitors, the coating layer, and the first and second opening sections, forming a conductive layer in the first and second opening sections and above the coating layer, the conductive layer being directly connected to the plug; and
    polishing at least the conductive layer.

2. The method according to claim 1, wherein the conductive layer and the coating layer are polished.

3. The method according to claim 1, the conductive layer being composed of a first portion and a second portion disposed on the first portion, a width of the first portion being smaller than a width of the second portion.

4. The method according to claim 3, a width of the plug being smaller than the width of the first portion of the conductive layer.

5. The method according to claim 1, an upper surface of the conductive layer being as high as an upper surface of the interlayer dielectric layer.

6. The method according to claim 1, the first ferroelectric capacitor having a first ellipsoidal shape in a top view, the first ellipsoidal shape having a first major axis, the first major axis being inclined with respect to a direction of rows.

7. The method according to claim 6, the second ferroelectric capacitor having a second ellipsoidal shape in the top view, the second ellipsoidal shape having a second major axis, the second major axis being inclined with respect to the direction of the rows.

8. A ferroelectric memory comprising:
    a substrate;
    a first interlayer dielectric layer formed above the substrate, the first interlayer dielectric layer including a plug;
    a second interlayer dielectric layer formed above the first interlayer dielectric layer;
    a first ferroelectric capacitor and a second ferroelectric capacitor formed above the second interlayer dielectric layer;
    a third interlayer dielectric layer formed above the first ferroelectric capacitor and the second ferroelectric capacitor; and
    a conductive layer formed between the first ferroelectric capacitor and the second ferroelectric capacitor and connected to the plug.

9. The ferroelectric memory according to claim 8, the conductive layer being composed of a first portion and a second portion disposed on the first portion, a width of the first portion being smaller than a width of the second portion.

10. The ferroelectric memory according to claim 9, a width of the plug being smaller than the width of the first portion of the conductive layer.

11. The ferroelectric memory according to claim 8, an upper surface of the conductive layer being as high as an upper surface of the interlayer dielectric layer.

12. The memory according to claim 8, the first ferroelectric capacitor having a first ellipsoidal shape in a top view, the first ellipsoidal shape having a first major axis, the first major axis being inclined with respect to a direction of rows.

13. The memory according to claim 12, the second ferroelectric capacitor having a second ellipsoidal shape in the top view, the second ellipsoidal shape having a second major axis, the second major axis being inclined with respect to the direction of the rows.

14. The memory of claim 8, wherein the conductive layer is directly connected to the plug.

* * * * *